(12) United States Patent
Katsap et al.

(10) Patent No.: US 7,345,290 B2
(45) Date of Patent: Mar. 18, 2008

(54) LENS ARRAY FOR ELECTRON BEAM LITHOGRAPHY TOOL

(75) Inventors: Victor Katsap, Belle Mead, NJ (US); Pieter Kruit, Delft (NL); Daniel Moonen, Delft (NL); Warren Kazmir Waskiewicz, Clinton, NJ (US)

(73) Assignee: Agere Systems Inc, Allentown, PA (US)

( * ) Notice: Subject to any disclaimer, the term of this patent is extended or adjusted under 35 U.S.C. 154(b) by 208 days.

(21) Appl. No.: 09/414,004

(22) Filed: Oct. 7, 1999

(65) Prior Publication Data

US 2003/0010934 A1    Jan. 16, 2003

(51) Int. Cl.
*G21K 5/10*   (2006.01)

(52) U.S. Cl. ............................. 250/492.2; 250/492.1; 250/396 R

(58) Field of Classification Search ............ 250/356 R, 250/492.2, 396 ML, 310, 311, 398, 423 R
See application file for complete search history.

(56) References Cited

U.S. PATENT DOCUMENTS

| | | | | |
|---|---|---|---|---|
| 3,107,313 A | * | 10/1963 | Hechtel | 315/5.16 |
| 3,651,360 A | * | 3/1972 | Sommeria | 313/454 |
| 3,798,478 A | * | 3/1974 | Say | 313/411 |
| 3,852,633 A | * | 12/1974 | Hunter | 313/411 |
| 3,886,398 A | * | 5/1975 | Feinstein | 315/5 |
| 4,091,311 A | * | 5/1978 | Mendelsohn et al. | 315/382 |
| 4,200,794 A | * | 4/1980 | Newberry et al. | 250/396 ML |
| 4,338,548 A | * | 7/1982 | Bono et al. | 315/382 |
| 4,381,473 A | * | 4/1983 | Endoh et al. | 313/414 |
| 4,390,789 A | * | 6/1983 | Smith et al. | 250/492.2 |
| 4,419,182 A | * | 12/1983 | Westerberg | 156/644 |
| 4,499,405 A | * | 2/1985 | Loda | 315/13.1 |
| 4,553,064 A | * | 11/1985 | Amboss | 313/448 |
| 4,588,928 A | | 5/1986 | Liu et al. | |
| 5,013,963 A | * | 5/1991 | Ikegami et al. | 313/414 |
| 5,059,804 A | * | 10/1991 | Fink et al. | 250/396 R |
| 5,079,112 A | | 1/1992 | Berger et al. | |
| 5,258,246 A | | 11/1993 | Berger et al. | |
| 5,376,792 A | * | 12/1994 | Schamber et al. | 250/311 |
| 5,936,335 A | * | 8/1999 | Clerc | 313/346 R |
| 5,937,972 A | * | 8/1999 | Andre | 187/210 |

(Continued)

FOREIGN PATENT DOCUMENTS

JP    61-85055    6/1986

(Continued)

OTHER PUBLICATIONS

"Mesh equipped Wehnelt source for SCALPEL", Katsap, Waskiewicz, Sewell, and Rouse, SPIE, vol. 3777, pp. 75-81.*

*Primary Examiner*—David Vanore

(57) ABSTRACT

A method and apparatus for controlling beam emittance by placing a lens array in a drift space of an illumination system component. The illumination system component may be an electron gun or a liner tube or drift tube, attachable to an electron gun. The lens array may be one or more mesh grids or a combination of grids and continuous foils. The lens array forms a multitude of microlenses resembling an optical "fly's eye" lens. The lens array splits an incoming solid electron beam into a multitude of subbeams, such that the outgoing beam emittance is different from the incoming beam emittance, while beam total current remains unchanged. The method and apparatus permit independent control of beam current and beam emittance, which is beneficial in a SCALPEL illumination system.

25 Claims, 9 Drawing Sheets

U.S. PATENT DOCUMENTS

| | | | |
|---|---|---|---|
| 5,949,078 A * | 9/1999 | Ooaeh et al. | 250/492.2 |
| 6,091,187 A * | 7/2000 | Golladay et al. | 313/310 |
| 6,333,508 B1 * | 12/2001 | Katsap et al. | 250/492.2 |
| 6,407,399 B1 * | 6/2002 | Livesay | 250/492.3 |

FOREIGN PATENT DOCUMENTS

| | | |
|---|---|---|
| JP | 61-263217 A | 11/1986 |
| JP | 06-338446 A | 12/1994 |

* cited by examiner

LENS ARRAY FOR ELECTRON BEAM LITHOGRAPHY TOOL

FIELD OF THE INVENTION

This invention relates to an illumination system for an electron beam lithography apparatus used for the manufacture of semiconductor integrated circuits.

BACKGROUND OF THE INVENTION

Electron beam exposure tools have been used for lithography in semiconductor processing for more than two decades. The first e-beam exposure tools were based on the flying spot concept of a highly focused beam, raster scanned over the object plane. The electron beam is modulated as it scans so that the beam itself generates the lithographic pattern. These tools have been widely used for high precision tasks, such as lithographic mask making, but the raster scan mode is found to be too slow to enable the high throughput required in semiconductor wafer processing. The electron source in this equipment is similar to that used in electron microscopes, i.e., a high brightness source focused to a small spot beam.

More recently, a new electron beam exposure tool was developed based on the SCALPEL (SCattering with Angular Limitation Projection Electron-beam Lithography) technique. In this tool, a wide area electron beam is projected through a lithographic mask onto the object plane. Since relatively large areas of a semiconductor wafer (e.g., 1 mm$^2$) can be exposed at a time, throughput is acceptable. The high resolution of this tool makes it attractive for ultra fine line lithography, i.e., sub-micron. The requirements for the electron beam source in SCALPEL exposure tools differ significantly from those of a conventional focused beam exposure tool, or a conventional TEM or SEM. While high resolution imaging is still a primary goal, this must be achieved at relatively high (10-100 μA) gun currents in order to realize economic wafer throughput.

The axial brightness required is relatively low, e.g., 10$^2$ to 10$^4$ Acm$^{-2}$sr$^{-1}$, as compared with a value of 10$^6$ to 10$^9$ Acm$^{-2}$sr$^{-1}$ for a typical focused beam source. However, the beam flux over the larger area must be highly uniform to obtain the required lithographic dose latitude and CD control.

A formidable hurdle in the development of SCALPEL tools was the development of an electron source that provides uniform electron flux over a relatively large area, has relatively low brightness, and high emittance, defined as D*α micron*milliradian, where D is beam diameter, and α is divergence angle. Conventional, state-of-the-art electron beam sources generate beams having an emittance in the 0.1-400 micron*milliradian range, while SCALPEL-like tools require emittance in the 1000 to 5000 micron*milliradian range.

Further, conventional SCALPEL illumination system designs have been either Gaussian gun-based or grid-controlled gun-based. A common drawback of both types is that beam emittance depends on actual Wehnelt bias, which couples beam current control with inevitable emittance changes. From a system viewpoint, independent control of the beam current and beam emittance is much more beneficial.

SUMMARY OF THE INVENTION

The present invention is directed to a charged particle illumination system component for an electron beam exposure tool and an electron beam exposure tool that provides independent emittance control by placing a lens array, which acts as an "emittance controller", in the illumination system component. In one embodiment, a conductive mesh grid under negative bias is placed in the SCALPEL lithography tool kept at ground potential, forming a multitude of microlenses resembling an optical "fly's eye" lens. The mesh grid splits an incoming solid electron beam into a multitude of subbeams, such that the outgoing beam emittance is different from the incoming beam emittance, while beam total current remains unchanged. The mesh grid enables beam emittance control without affecting beam current. In another embodiment, the illumination system component is an electron gun. In yet another embodiment, the illumination system component is a liner tube, connectable to a conventional electron gun.

The optical effect of the mesh grid may be described in geometrical terms: each opening in the mesh acts as a microlens, or lenslet, creating its own virtual source, or cross-over, having diameter d, on one side of the mesh grid. Each individual subbeam takes up geometrical space close to L, where L equals the mesh pitch. The beam emittance ratio after the mesh grid to the one created by the electron gun, equals $$r=(L/d)^2.$$

In another embodiment of the present invention, the mesh grid includes multiple (for example, two, three, or more) meshes. In an odd numbered configuration (greater than one), the outward two meshes may have a curved shape; such a lens would enable beam emittance control and also reduce spherical aberration.

In another embodiment of the present invention, the lens array is a continuous lens made of foil.

BRIEF DESCRIPTION OF THE DRAWINGS

FIG. 6 illustrates the potential across the mesh grid.

FIG. 6(c) specifically illustrates a mesh grid arrangement where the outward two meshes have a curved shape.

DETAILED DESCRIPTION

Figure 1:
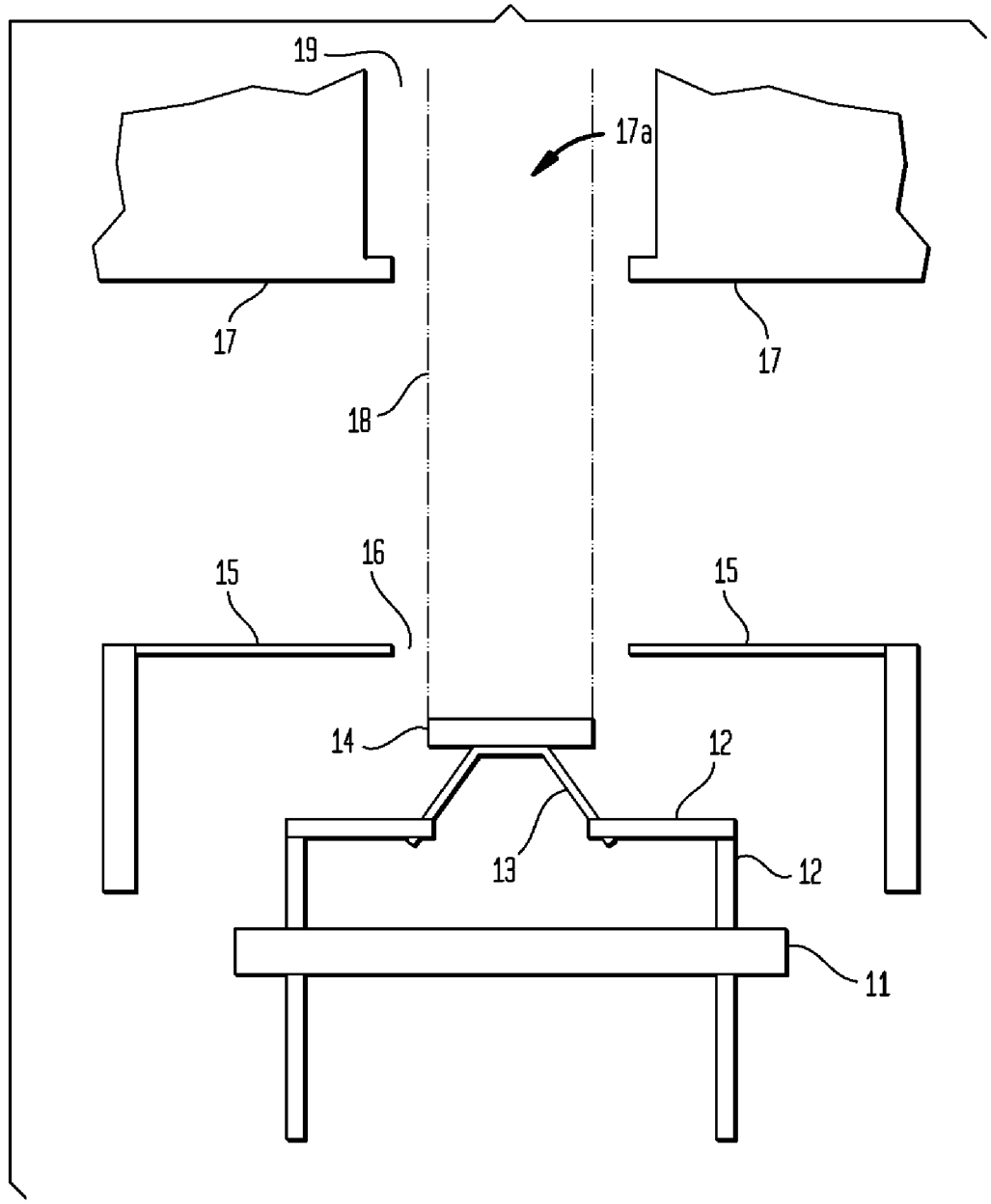
FIG. 1 is a schematic diagram of one conventional Wehnelt electron gun with a tantalum disk emitter.

Referring to FIG. 1, a conventional Wehnelt electron gun assembly is shown with base 11, cathode support arms 12, cathode filament 13, a Wehnelt electrode including Wehnelt horizontal support arms 15 and conventional Wehnelt aperture 16. The base 11 may be ceramic, the support members 12 may be tantalum, steel, or molybdenum. The filament 13 may be tungsten wire, the material forming the Wehnelt aperture 16 may be steel or tantalum, and the electron emitter 14 is, e.g., a tantalum disk. The effective area of the electron emitter is typically in the range of 0.1-5.0 mm². The electron emitter 14 is preferably a disk with a diameter in the range of 0.05-3.0 mm. The anode is shown schematically at 17, including anode aperture 17a, the electron beam at 18, and a drift space at 19. For simplicity the beam control apparatus, which is conventional and well known in the art, is not shown. It will be appreciated by those skilled in the art that the dimensions in the figures are not necessarily to scale. An important feature of the electron source of SCALPEL exposure tools is relatively low electron beam brightness, as mentioned earlier. For most effective exposures, it is preferred that beam brightness be limited to a value less than $10^5$ Acm$^{-2}$sr$^{-1}$. This is in contrast with conventional scanning electron beam exposure tools which are typically optimized for maximum brightness. See e.g., U.S. Pat. No. 4,588,928 issued May 13, 1986 to Liu et al.

Figure 2:
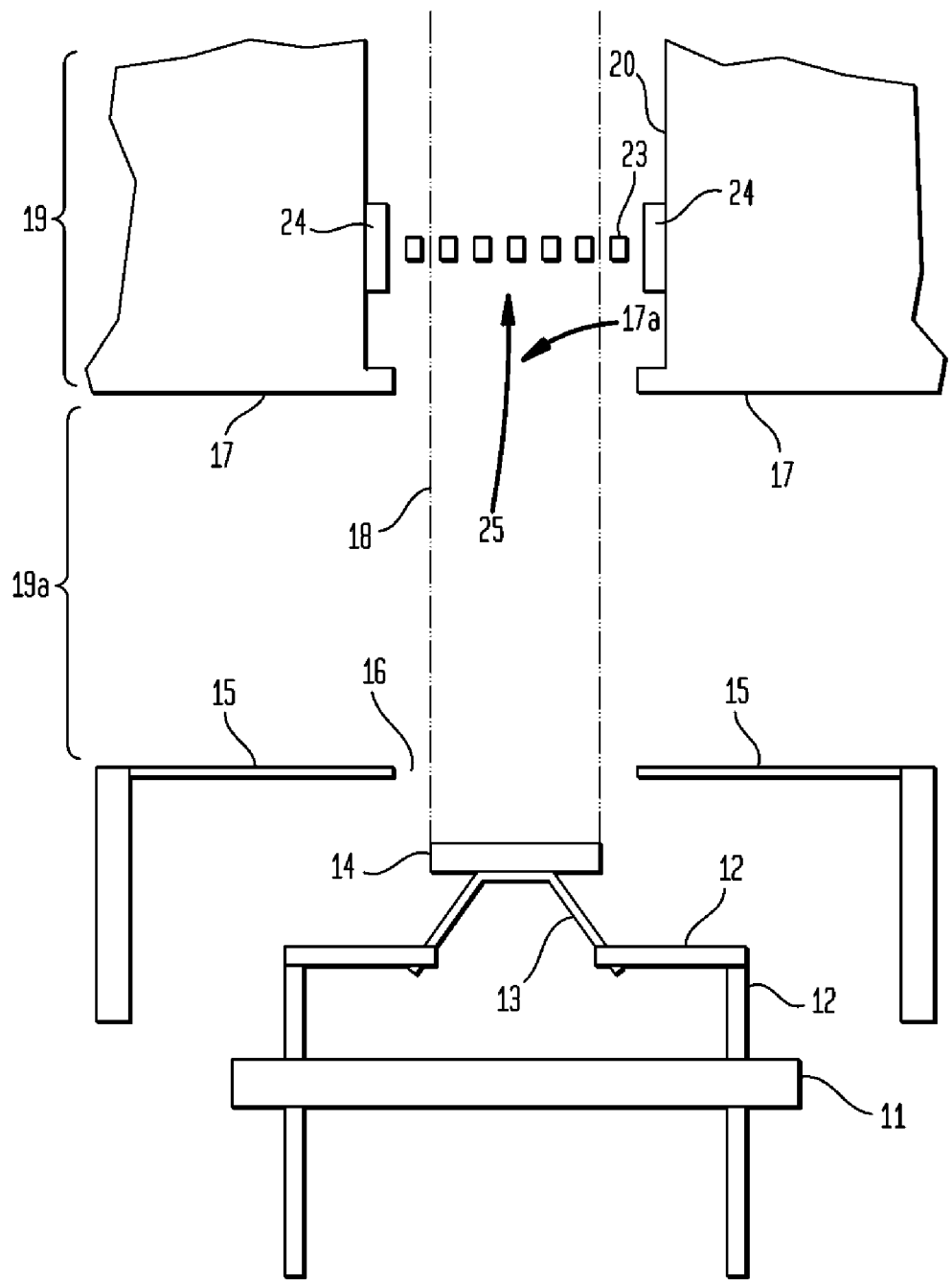
FIG. 2 is a schematic diagram of an electron gun modified in accordance with the invention.

The present invention is shown in FIG. 2. A mesh grid 23 is disposed in the path of the electron emission 25 in the drift space 19. According to FIG. 2, the mesh grid 23 is placed in the electrostatic field-free drift space 19, insulated from the drift tube, or liner 20, and it is biased to a specified potential Um. The potential difference between the mesh grid 23 and the liner 20 creates microlenses out of each opening in the mesh grid 23. The electron beam 18 is split into individual subbeams (beamlets), and each beamlet is focused moving through its respective mesh cell, or microlens. The mesh grid 23 is separated from the liner 20 by an insulator 24. The mesh grid 23 and the insulator 24 may both be part of a mesh holder.

One characteristic of the drift space 19 is that there is substantially no or no electric field present. The substantial absence of the electric field results in no acceleration or deceleration of electrons, hence the electrons are permitted to "drift", possibly in the presence of a magnetic field. This in contrast to the vacuum gap 19a, which has a strong electric field.

Figure 2A:
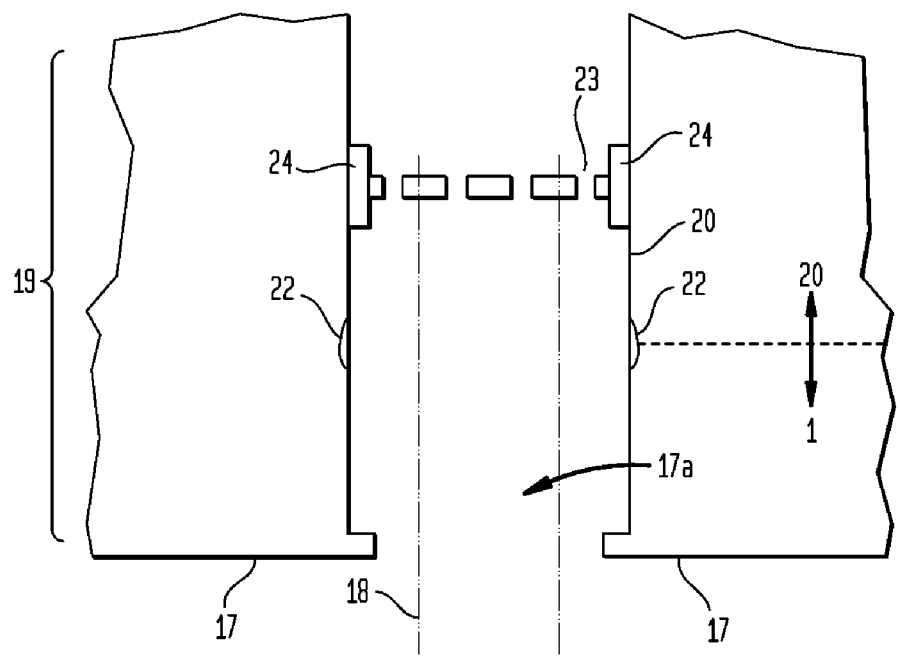
FIGS. 2(a) and 2(b) illustrate variations of the present invention.
Figure 2B:
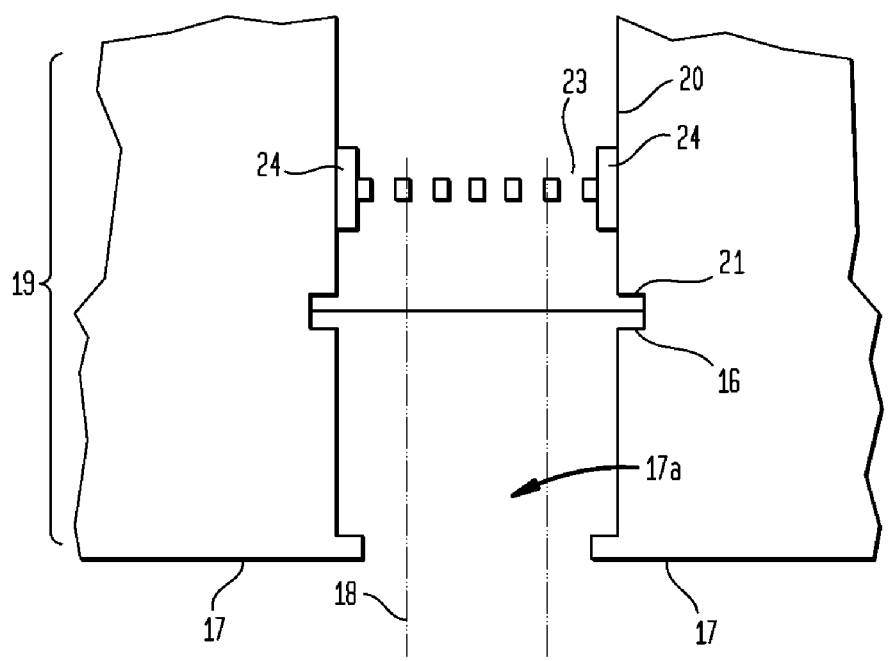

FIGS. 2(a) and 2(b) illustrate variations on FIG. 2. In particular, FIGS. 2(a) and 2(b) both show the mesh grid 23 within a liner 20 attached to an electron gun assembly 1. In FIG. 2(a), the liner 20 is attached to the electron gun assembly 1 via a liner flange 21 and an electron gun flange 16. In FIG. 2(b), the liner 20 is attached to the electron gun assembly 1 at weld 22. The liner 20 and electron gun assembly 1 could be attached by other techniques known to one of ordinary skill in the art, as long as the attachment is vacuum tight. Alternatively, the mesh grid 23 could be placed below the boundary between the liner flange 21 and the electron gun flange 16 or below the weld 22, within the electron gun assembly 1, as long as the mesh grid 23 remains within the drift space 19.

Figure 2C:
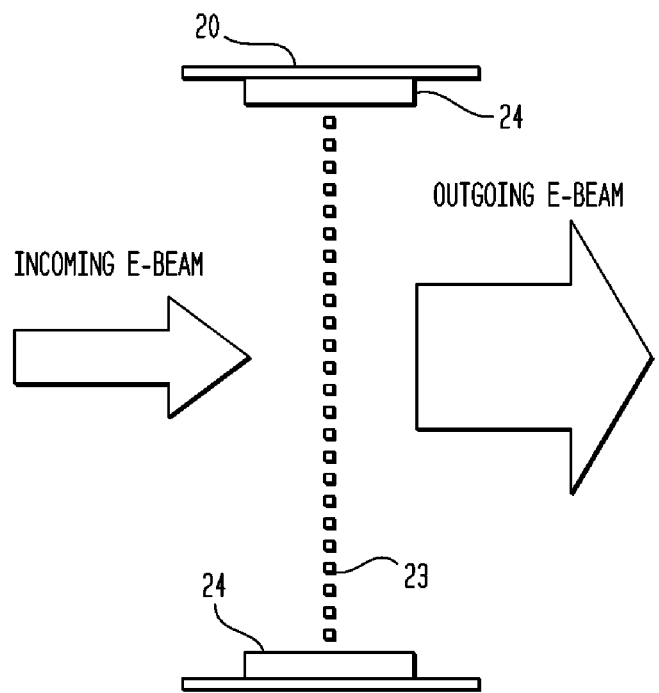
FIG. 2(c) illustrates the effect of the mesh grid on the electron beam.

One advantage of the embodiments illustrates in FIGS. 2(a) and 2(b) is that they permit the use of conventional non-optimal electron guns. A conventional electron gun produces a beam which is too narrow and too non-uniform. The arrangements in FIGS. 2(a) and 2(b) permit increased performance utilizing a conventional electron gun, since the mesh grid 23 contained within the liner 20 improves the beam emittance by making it wider and more uniform, which is more suitable for SCALPEL applications. The effect of the mesh grid 23 is more clearly illustrated in FIG. 2(c).

Figure 3:
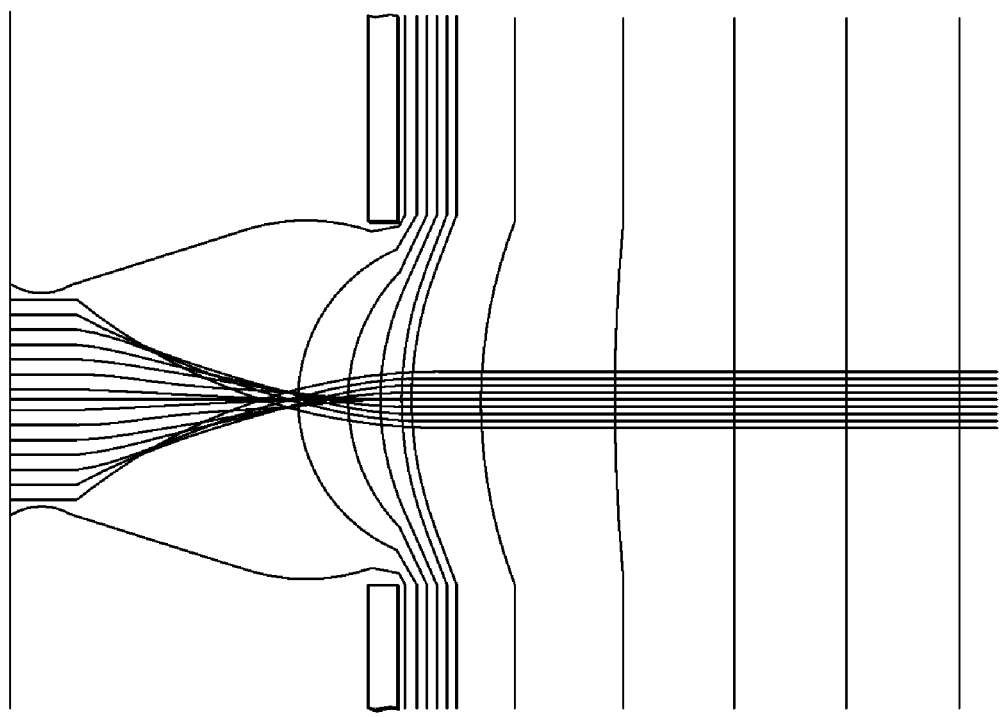
FIG. 3 is a schematic representation of the electron emission profile from the conventional Wehnelt electron gun.
Figure 4:
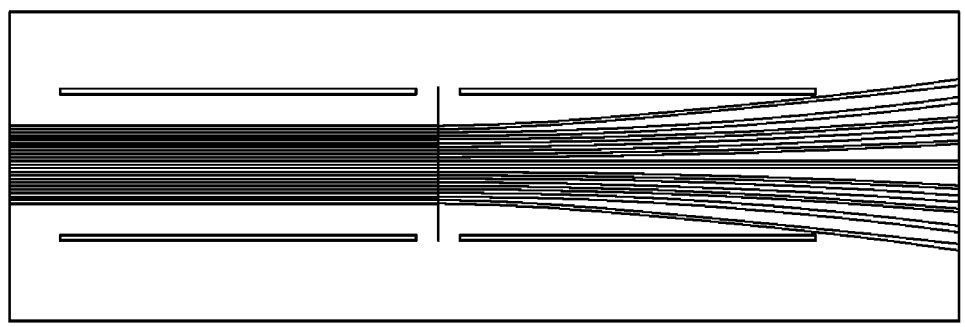
FIG. 4 illustrates the effect of the mesh grid in one embodiment of the present invention.

The electron emission pattern from the Wehnelt gun of FIG. 1, is shown in FIG. 3. The relatively non-uniform, bell curve shaped output from the Wehnelt is evident. FIG. 4 illustrates the electron beam emittance through the mesh grid 23. The emittance on the left side of the mesh grid 23 is low, whereas after passing through the mesh grid 23, the emittance of the electron beam is much higher.

The screen element that forms the mesh grid 23 can have a variety of configurations. The simplest is a conventional woven screen with square apertures. However, the screen may have triangular shaped apertures, hexagonal close packed apertures, or even circular apertures. It can be woven or non-woven. Techniques for forming suitable screens from a continuous layer may occur to those skilled in the art. For example, multiple openings in a continuous metal sheet or foil can be produced by technique such as laser drilling. Fine meshes can also be formed by electroforming techniques. The mesh grid 23 should be electrically conducting but the material of the mesh is otherwise relatively inconsequential. Tantalum, tungsten, molybdenum, titanium, or even steel are suitable materials, as are some alloys as would be known to one skilled in the art. The mesh grid 23 preferably has a transparency in the range of 40-90%, with transparency defined as the two dimensional void space divided by the overall mesh grid area.

Figure 4A:
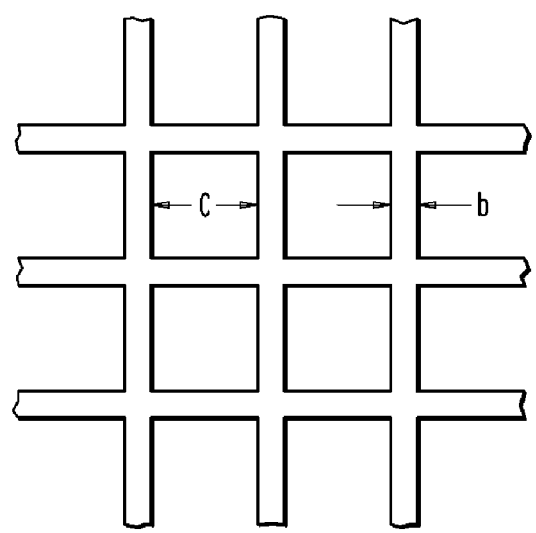
FIG. 4(a) is a schematic diagram of a mesh grid of the invention showing the relevant dimensions.

With reference to FIG. 4(a), the mesh grid has bars "b" of approximately 50 μm, and square cells with "C" approximately 200 μm. This mesh grid has a transparency of approximately 65%. Examples of mesh grid structures that were found suitable are represented by the examples in the following table.

TABLE I

|  | Cell dimension "C", μm | Bar width "b", μm |
| --- | --- | --- |
| Grid #1 | 200 | 50 |
| Grid #2 | 88 | 37 |
| Grid #3 | 54 | 31 |

The cell dimension "C" is the width of the opening in a mesh with a square opening. For a rectangular mesh grid the dimension "C" is approximately the square root of the area of the opening. It is preferred that the openings be approximately symmetrical, i.e., square or round.

The thickness t of the mesh grid is relatively immaterial except that the aspect ratio of the openings, C/t, is preferably greater than 1. A desirable relationship between the mesh grid parameters is given by:

$$C{:}t > 1.5$$

In yet another embodiment, the lens array may include more than one mesh. In one embodiment, the lens array includes three meshes. The outer two meshes may be prepared having curved shape; such a lens would provide beam emittance control and decrease spherical aberration.

In addition the outer two meshes may also be replaced with foils, such as an SiN foil, with a thickness of approximately 0.1 μm. Such a film would permit substantially no physical interaction (inelastic collisions), and therefore a transparency approaching 100%.

Due to the large current being passed through the lens array (either mesh or continuous), the transparency is important. If a percentage of the beam impacts the structure of the mesh or continuous film, the high current is likely to melt the mesh or continuous film.

Figure 5:
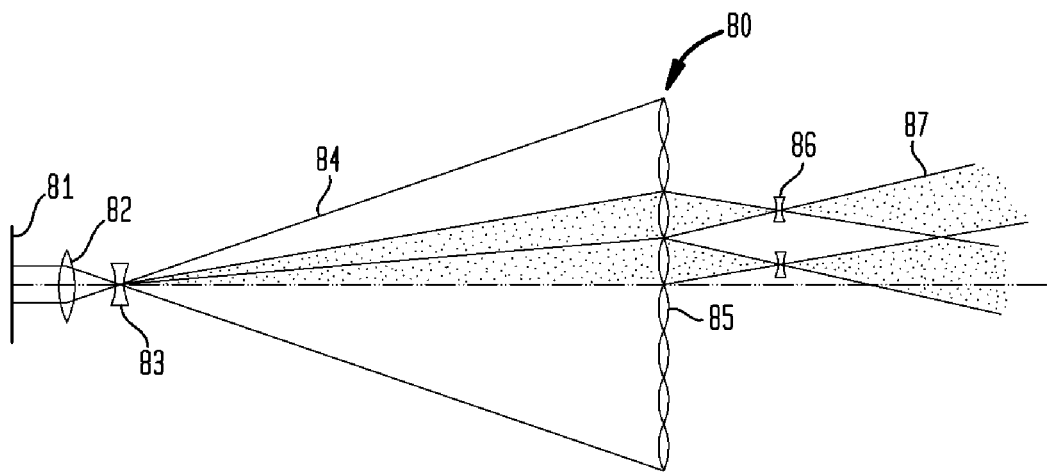
FIG. 5 is a more general representation of the optics of the present invention.

FIG. 5 is more general representation of the optics of the present invention. 81 is the cathode of a standard high brightness electron gun, either a W hairpin, or a LaB$_6$ crystal or a BaO gun as used in for example a CRT. 82 is the gun lens formed by the Wehnelt electrode and the extraction field. 83 is the gun cross-over with diameter dg. 84 is the electron beam emerging from the gun, with half aperture angle $\alpha_g$ as they appear looking back from where the beam has been accelerated to 100 kV. The emittance of the gun is now $$E = \frac{\pi^2}{4} d_g^2 \alpha_g^2$$

After the beam has spread out to a diameter which is considerably larger than the diameter of the lenslets 85, the lens array 80 is positioned. Each lenslet 85 creates an image 86 of the gun cross-over with size $d_i$. Each subbeam 87 now has a half opening angle $\alpha$.

The emittance increase created by the lens array 80 can be derived. Liouvilles theorem states that the particle density in six dimensional phase space cannot be changed using conservative forces such as present in lenses. This implies that the emittance within each subbeam that goes through one lenslet is conserved and thus:

$$N \cdot \frac{\pi^2}{4} d_i^2 \; \alpha_i^2 = \frac{\pi^2}{4} d_g^2 \alpha_g^2$$

where N is the number of subbeams.

The emittance of the beam appears to be $$N \cdot \frac{\pi^2}{4} L^2 \alpha_R^2$$

where L is the pitch of the lenslets 85 and thus $$V \cdot \frac{\pi^2}{4} L^2$$

is the total area of the lens array 80. The new emittance of the beam is termed the effective emittance. The emittance increase is $E_{eff}/E_{gun} = L^2/d_i^2$.

It is not necessary to create a real cross-over with the lenslet array. The calculation of the emittance increase then proceeds differently, but the principle still works.

For a large emittance increase, it is beneficial to use a large pitch of the mesh grid 23. However, the newly formed beam should include a reasonably large number of subbeams so that the subbeams will overlap at essential positions in the system such as the mask. Example 1 illustrates typical values.

EXAMPLE 1

A LaB$_6$ gun of 0.2 mm diameter is used. The cross-over after the gun lens could be 60 μm, thus the emittance increase is a factor of eight using Grid #1 in Table 1.

Figure 6A:
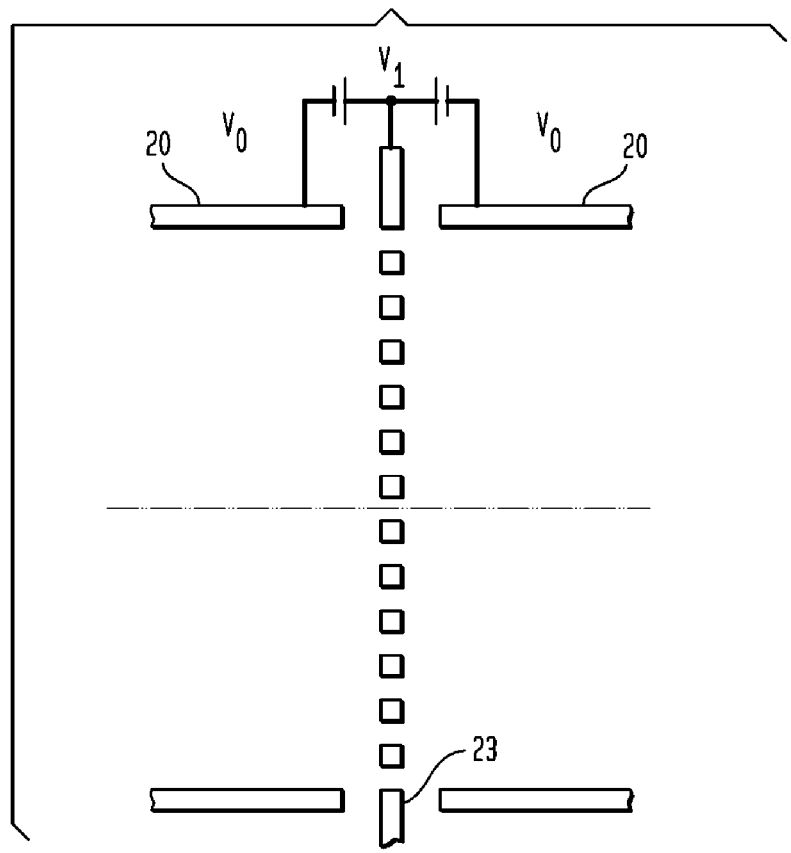
FIGS. 6(a), 6(b), and 6(c) illustrate the potential across alternative mesh grids.
Figure 6B:
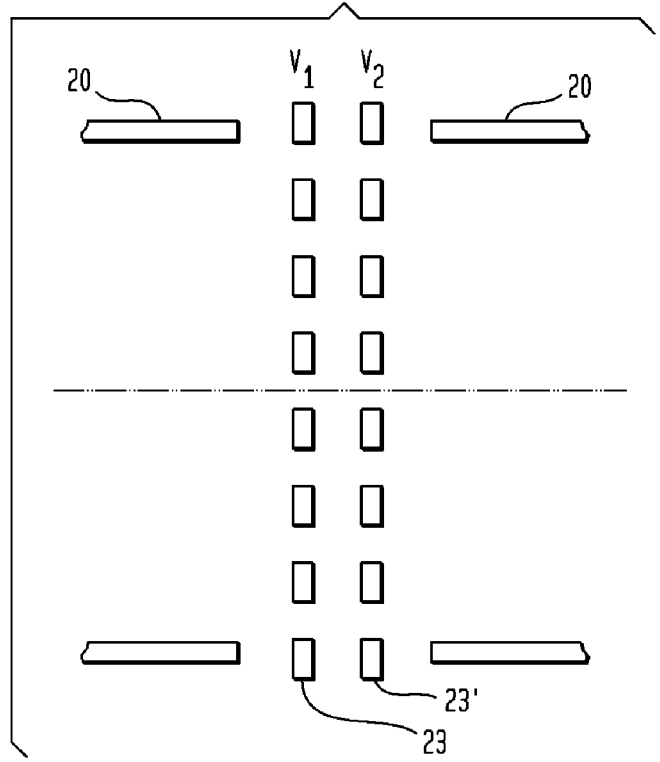
Figure 6C:
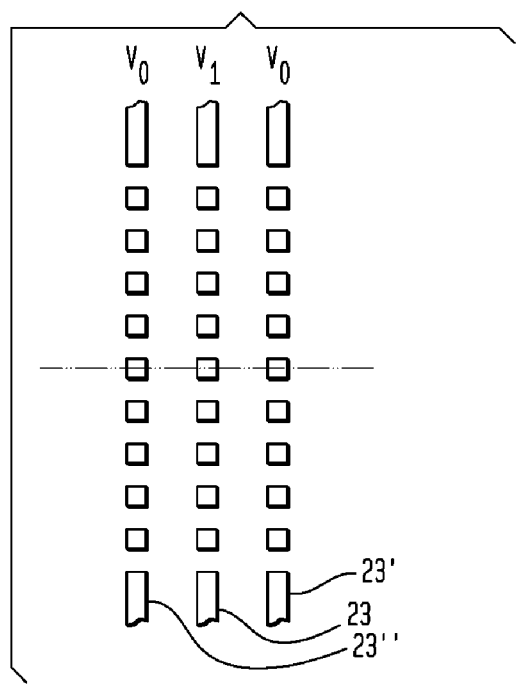

The lens array 80 may be the mesh grid 23 at potential V$_1$, between liner 20 at potential V$_0$ as shown in FIG. 6, or include two grids 23 and 23' at the potentials illustrated in FIG. 6(a) or three grids 23, 23', 23'' at the potentials illustrated in FIGS. 6(b) and 6(c), or any other configuration which contains a grid mesh with an electrostatic field perpendicular to the gridplane.

The focal distance of the lenslets 85 in FIG. 5 is typically in the order of 4×Vacc/Efield, where Vacc is the acceleration potential of the electron beam and Efield the strength of the electrostatic field. In Example 1, the distance between the gun cross-over and the lens array could be typically 100 mm, calling for a focal length of about 50 mm to create demagnified images. Thus, at 100 kV acceleration, the field should be 10 kV/mm.

In an alternative embodiment, if a specific configuration requires a strong field, the mesh grid 23 could be incorporated in the acceleration unit of the gun, between the cathode and the anode. This would have the additional advantage that the beam has not yet been accelerated to the full 100 kV at that point.

In an alternative embodiment, the mesh grid 23 could also be incorporated in the electron gun in the Wehnelt-aperture 16 of FIG. 2. The mesh pitch must again be much smaller than the cathode diameter. This would lead to lenslet sizes in the order of μm's.

Figure 7:
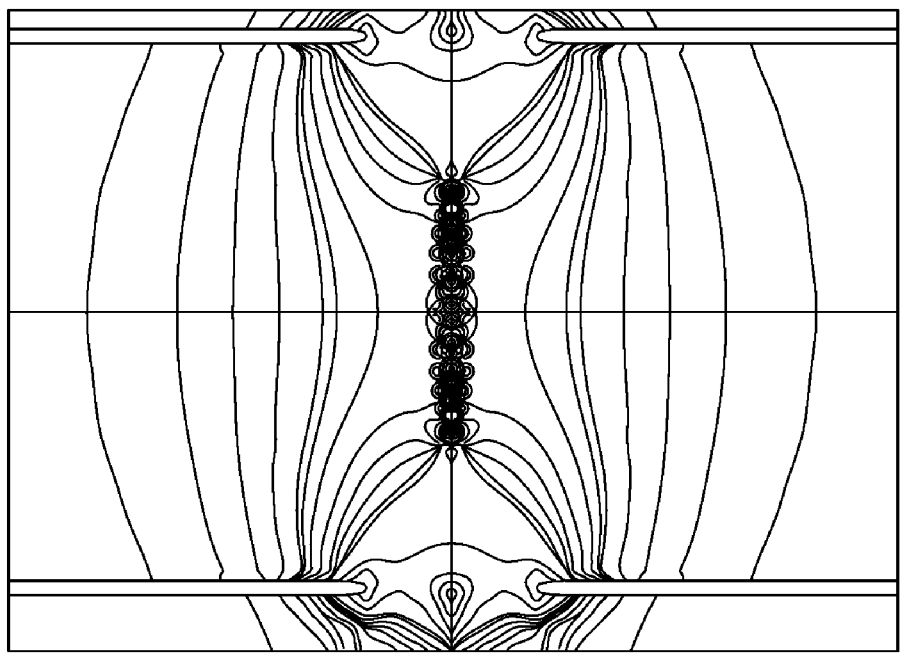
FIG. 7 illustrates the equipotential fields around a mesh grid, calculated by the SOURCE computer simulation model with a bias voltage of −40 kV.

The present invention has been confirmed by computer simulation with both Charged Particle Optics (CPO, Bowring Consultant, Ltd., and Manchester University) and SOURCE (by MEBS, Ltd.) models. In the SOURCE model, the mesh grid 23 is approximated by a series of circular slits. In both the CPO and SOURCE programs, a lens including two grounded cylinders with a biased mesh in the gap between those cylinders is simulated. FIG. 7 shows a detail of the SOURCE model, with fields. The lensfields are clearly visible in the openings in the mesh.

Figure 8:
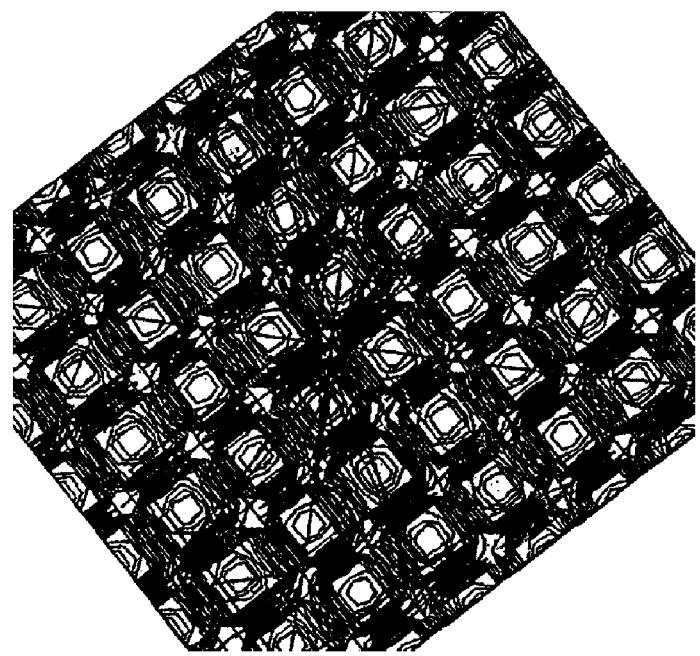
FIG. 8 illustrates the multi lens effect in the mesh grid, calculated using the CPO3d computer simulation model with a bias voltage of −40 kV.

Further, the modeling has been done with a three-dimensional simulation program CPO3d. FIG. 8 illustrates the potential distribution in the plane of the mesh. Again, the multi-lens effect in the mesh grid can be clearly seen.

As indicated above the electron gun of the invention is most advantageously utilized as the electron source in a SCALPEL electron beam lithography machine. Fabrication of semiconductor devices on semiconductor wafers in current industry practice contemplates the exposure of polymer resist materials with fine line patterns of actinic radiation, in this case, electron beam radiation. This is achieved in conventional practice by directing the actinic radiation through a lithographic mask and onto a resist coated substrate. The mask may be positioned close to the substrate and the image of the mask projected onto the substrate for projection printing.

SCALPEL lithography tools are characterized by high contrast patterns at very small linewidths, i.e., 0.1 μm or less. They produce high resolution images with wide process latitude, coupled with the high throughput of optical projection systems. The high throughput is made possible by using a flood beam of electrons to expose a relatively large area of the wafer. Electron beam optics, comprising standard magnetic field beam steering and focusing, are used to image the flood beam onto the lithographic mask, and thereafter, onto the substrate, i.e., the resist coated wafer. The lithographic mask is composed of regions of high electron scattering and regions of low electron scattering, which regions define the features desired in the mask pattern. Details of suitable mask structures can be found in U.S. Pat. Nos. 5,079,112 issued Jan. 7, 1992, and 5,258,246 issued Nov. 2, 1993, both to Berger et al.

An important feature of the SCALPEL tool is the back focal plane filter that is placed between the lithographic mask and the substrate. The back focal plane filter functions by blocking the highly scattered electrons while passing the weakly scattered electrons, thus forming the image pattern on the substrate. The blocking filter thus absorbs the unwanted radiation in the image. This is in contrast to conventional lithography tools in which the unwanted radiation in the image is absorbed by the mask itself, contributing to heating and distortion of the mask, and to reduced mask lifetime.

Figure 9:
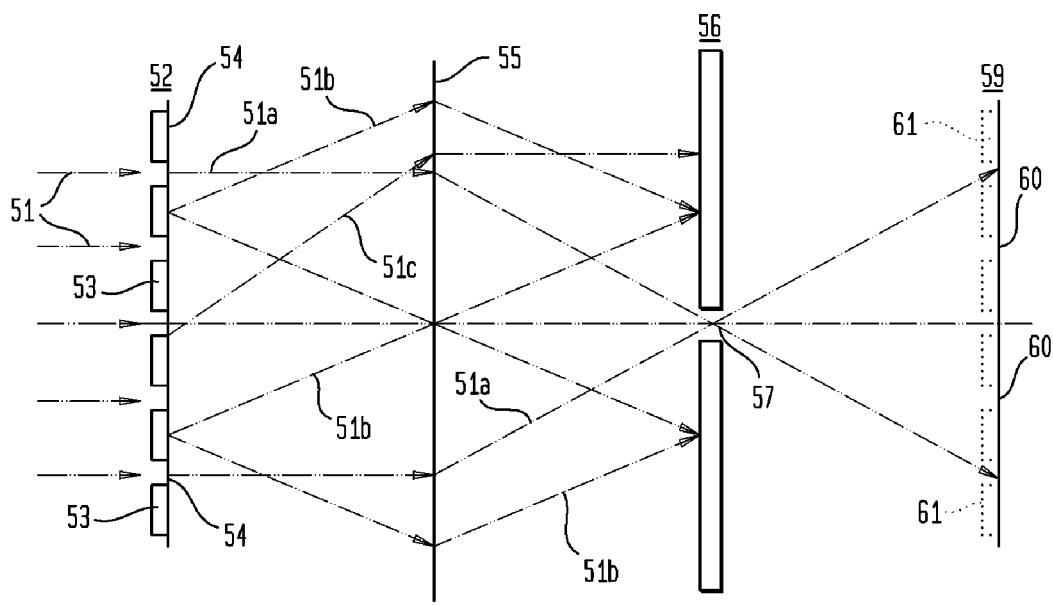
FIG. 9 is a schematic diagram illustrating the principles of the SCALPEL exposure system.

The principles on which SCALPEL lithography systems operate are illustrated in FIG. 9. Lithographic mask 52 is illuminated with a uniform flood beam 51 of 100 keV electrons produced by the electron gun of FIG. 2. The membrane mask 52 comprises regions 53 of high scattering material and regions 54 of low scattering material. The weakly scattered portions of the beam, i.e., rays 51a, are focused by magnetic lens 55 through the aperture 57 of the back focal plane blocking filter 56. The back focal plane filter 56 may be a silicon wafer or other material suitable for blocking electrons. The highly scattered portions of the electron beam, represented here by rays 51b and 51c, are blocked by the back focal plane filter 56. The electron beam image that passes the back focal plane blocking filter 56 is focused onto a resist coated substrate located at the optical plan represented by 59. Regions 60 replicate the features 54 of the lithographic mask 52, i.e., the regions to be exposed, and regions 61 replicate the features 53 of the lithographic mask, i.e., the regions that are not to be exposed. These regions are interchangeable, as is well known in the art, to produce either negative or positive resist patterns.

A vital feature of the SCALPEL tool is the positioning of a blocking filter at or near the back focal plane of the electron beam image. Further details of SCALPEL systems can be found in U.S. Pat. Nos. 5,079,112 issued Jan. 7, 1992, and 5,258,246 issued Nov. 2, 1993, both to Berger et al. These patents are incorporated herein by reference for such details that may be found useful for the practice of the invention.

It should be understood that the figures included with his description are schematic and not necessarily to scale. Device configurations, etc., are not intended to convey any limitation on the device structures described here.

For the purpose of definition here, and in the appended claims, the term Wehnelt emitter is intended to define a solid metal body with an approximately flat emitting surface, said flat emitting surface being symmetrical, i.e., having the shape of a circle or regular polygon. Also for the purpose of definition, the term substrate is used herein to define the object plane of the electron beam exposure system whether or not there is a semiconductor workpiece present on the substrate. The term electron optics plane may be used to describe an x-y plane in space in the electron gun and the surface onto which the electron beam image is focused, i.e., the object plane where the semiconductor wafer is situated.

As set forth above, in the present invention, an electron optical lens array is inserted into the illumination optics of the SCALPEL tool. The position of this lens array, or fly's eye lens, is such that each lenslet creates a beam cross-over with a smaller diameter d than the distance between the lenslets L, which increases the effective emittance of the beam by a factor $(L/d)^2$. The electron optical lens array is a mesh grid with an electrostatic field perpendicular to the grid. One advantage over conventional systems is that the present invention allows the use of a standard high brightness electron gun. Another advantage is that the effective emittance can be varied without stopping a large part of the electron current on beam shaping apertures which is now the only way to change the emittance. Yet another advantage is that a homogeneous illumination of the mask may be obtained.

Various additional modifications of this invention will occur to those skilled in the art. All deviations from the specific teachings of this specification that basically rely on the principles and their equivalents through which the art has been advanced are properly considered within the scope of the invention as described and claimed.

What is claimed is:

1. An electron beam exposure tool, comprising:
   an electron gun including an electron gun assembly, the electron gun for generating an electron beam; and
   at least one electron beam splitting lens array, placed in a drift space in said electron gun assembly, adjacent to said electron gun, for splitting the electron beam into a plurality of sub beams to control emittance of said electron beam exposure tool, the drift space being a region that, during operation, is substantially free of electric field lines/gradients originating from outside said drift space.

2. The electron beam exposure tool of claim 1, wherein said at least one lens array is placed in a liner tube, connected to said electron gun assembly.

3. The electron beam exposure tool of claim 2, wherein the liner tube and said electron gun are secured vacuum-tight.

4. The electron beam exposure tool of claim 2, wherein the liner tube and said electron gun are bolted together.

5. The electron beam exposure tool of claim 2, wherein the liner tube and said electron gun are welded together.

6. The electron beam exposure tool of claim 1, said at least one lens array including at least one mesh grid.

7. The electron beam exposure tool of claim 1, said at least one lens array including at least two mesh grids.

8. The electron beam exposure tool of claim 1, said at least one lens array including at least three mesh grids.

9. The electron beam exposure tool of claim 1, said at least one lens array including at least one continuous foil.

10. The electron beam exposure tool of claim 1, said at least one lens array having a transparency between 40-90%.

11. The electron beam exposure tool of claim 1, wherein said electron beans exposure tool is a SCALPEL tool, modified electron beam exposure system (MEBES) tool, or EBES tool.

12. The electron beam exposure tool of claim 1, wherein said lens array increases emittance of an electron beam by producing a divergent beam from an incoming electron beam.

13. The electron beam exposure tool of claim 6, wherein the emittance of the electron beam is increased by a factor substantially equal to $(L/d)^2$, where L represents a pitch of said at least one mesh grid, and d represents a diameter of a beam crossover created by each opening in said at least one mesh grid.

14. The electron beam exposure tool of claim 8, wherein said at least one lens array includes an odd number of mesh grids, including two outer mesh grids having a curved shape, and wherein spherical aberration of an electron beam passing through said at least one lens array is reduced.

15. A method of controlling beam emittance, comprising:

supplying an electron beam with an electron gun including an electron assembly; and splitting the electron beam via at least one electron beam splitting lens array placed in a drift space in the electron gun assembly, adjacent to the electron gun, the drift space being a region that, during operation, is substantially free of electric field lines/gradients originating from outside said drift space.

16. The method of claim 15, wherein the at least one lens array is placed in a liner tube, connected to said electron gun assembly.

17. The method of claim 16, wherein the liner tube and the electron gun are secured vacuum-tight.

18. The method of claim 16, wherein the liner tube and the electron gun are bolted together.

19. The method of claim 16, wherein the liner tube and the electron gun are welded together.

20. The method of claim 15, wherein the at least one lens array includes at least one mesh grid.

21. The method of claim 15, wherein the at least one lens array includes at least two mesh grids.

22. The method of claim 15, wherein the at least one lens array includes at least three mesh grids.

23. The method of claim 15, said at least one lens array including at least one continuous foil.

24. The method of claim 15, said at least one lens array having a transparency between 40-90%.

25. The method of claim 15, wherein said method is performed by an electron beam exposure tool, including a SCALPEL tool, a modified electron beam exposure system (MEBES) tool, or an EBBS tool.

* * * * *